United States Patent
Xie

(10) Patent No.: US 10,067,166 B2
(45) Date of Patent: Sep. 4, 2018

(54) CIRCUIT FOR SAMPLING CURRENT AND SYSTEM FOR SAMPLING CURRENT OF TOTEM-POLE BRIDGELESS CIRCUIT

(71) Applicant: Hynetek Semiconductor Co., Ltd., Shenzhen (CN)

(72) Inventor: Renjian Xie, Shenzhen (CN)

(73) Assignee: HYNETEK SEMICONDUCTOR CO., LTD., Shenzhen (CN)

( * ) Notice: Subject to any disclaimer, the term of this patent is extended or adjusted under 35 U.S.C. 154(b) by 0 days.

(21) Appl. No.: 15/391,102

(22) Filed: Dec. 27, 2016

(65) Prior Publication Data
US 2017/0212152 A1    Jul. 27, 2017

(30) Foreign Application Priority Data
Jan. 27, 2016    (CN) .......................... 2016 1 0057340

(51) Int. Cl.
| | | |
|---|---|---|
| G01R 15/18 | (2006.01) | |
| G01R 19/00 | (2006.01) | |
| H01F 38/28 | (2006.01) | |
| H01F 38/32 | (2006.01) | |

(52) U.S. Cl.
CPC ....... G01R 15/185 (2013.01); G01R 19/0092 (2013.01); H01F 38/28 (2013.01); H01F 38/32 (2013.01)

(58) Field of Classification Search
CPC ... G01R 15/185; G01R 19/0092; H01F 38/32; H01F 38/28
See application file for complete search history.

(56) References Cited

U.S. PATENT DOCUMENTS

2009/0290397 A1* 11/2009 Hua .................. H02M 3/33546
                                                    363/127
2016/0134185 A1*  5/2016 Wang ...................... H02M 1/42
                                                    323/235

FOREIGN PATENT DOCUMENTS

| CN | 101707441 A | 5/2010 |
|---|---|---|
| CN | 101958550 A | 1/2011 |
| CN | 102721848 A | 10/2012 |
| CN | 103809007 A | 5/2014 |
| JP | 2014042433 A | 3/2014 |

* cited by examiner

Primary Examiner — Son Le
Assistant Examiner — Akm Zakaria
(74) Attorney, Agent, or Firm — Ladas & Parry LLP

(57) ABSTRACT

A circuit for sampling current includes a current transformer, a reset resistor, a diode, a sampling switch, and a current sampling resistor. The current transformer includes a primary winding and a secondary winding. The reset resistor and two ends of the secondary winding are connected in parallel. The sampling switch, the diode, and the current sampling resistor are connected in series and then connected to two ends of the reset resistor in parallel. The primary winding is for connecting to a circuit to be sampled. When a current flows through the primary winding and the circuit to be sampled and the sampling switch is turned on at a negative AC half cycle, the circuit for sampling current samples the current flowing through the circuit to be sampled.

8 Claims, 12 Drawing Sheets

CIRCUIT FOR SAMPLING CURRENT AND SYSTEM FOR SAMPLING CURRENT OF TOTEM-POLE BRIDGELESS CIRCUIT

The present disclosure claims priority to Chinese Patent Application No. CN201610057340.7, filed with the Chinese Patent Office on Jan. 27, 2016, titled "circuit for sampling current and system for sampling current of Totem-Pole bridgeless circuit," the entire contents of which are incorporated herein by reference.

TECHNICAL FIELD

The present disclosure relates to the field of circuit control, and particularly, to a circuit for sampling current and a system for sampling current of a Totem-Pole bridgeless circuit.

BACKGROUND

For energy conversion systems, the conversion efficiency of the power supplies is of great importance. Compared with conventional power conversion circuits, the bridgeless circuits can eliminate part or all of diodes, thus reducing the conduction losses of the circuits, and exhibiting advantages in efficient energy conversion. As a kind of bridgeless circuit, the Totem-Pole bridgeless circuits have such advantages as simple circuit structure and high conversion efficiency, and thus have been increasingly applied in recent years.

FIGS. 1a and 1b illustrate circuit diagrams of a Totem-Pole bridgeless circuit. Take FIG. 1 as an example, the first bridge arm unit 210 and the second bridge arm unit 220 are connected to each other in parallel. The first bridge arm unit 210 includes two switch tubes S1, S2 which are connected in series in the same direction. The second bridge arm unit 220 includes two diodes D1, D2 which are connected in series in the same direction. A power supply AC1 and an inductor L1 are positioned between a connection point of the two switch tubes and a connection point of the two diodes. A capacitor C1 and a load RL are first connected in parallel and then are in parallel connection to the first bridge arm unit 210 and the second bridge arm unit 220.

In the Totem-Pole bridgeless circuits, a main challenge is to sample the inductive current whereby achieving the control of the timing sequence of the switch tubes S1, S2.

SUMMARY

An embodiment of the present disclosure provides a circuit for sampling current, the circuit for sampling current includes a first current transformer, a first reset resistor, a first diode, a first sampling switch, and a current sampling resistor; the first current transformer comprising a primary winding and a secondary winding. The first reset resistor and two ends of the secondary winding are connected in parallel. The first sampling switch, the first diode, and the current sampling resistor are connected in series and then connected to two ends of the first reset resistor in parallel. The primary winding is for connecting to a circuit to be sampled. When a current flows through the primary winding and the circuit to be sampled and the first sampling switch is turned on at a negative AC half cycle, the circuit for sampling current samples the current flowing through the circuit to be sampled.

Another embodiment of the present disclosure provides a system for sampling current. The system for sampling current includes a Totem-Pole bridgeless circuit which includes a first bridge arm unit, a second bridge arm unit, and a load unit that are connected in parallel between a first parallel connection point and a second parallel connection point. The first bridge arm unit includes a first switch tube and a second switch tube which are connected in series in a same direction; the second bridge arm unit includes a first diode and a second diode which are connected in series in a same direction; the load unit includes a capacitor and a load resistor which are connected in parallel; a power supply and an inductor are connected in series between a first connection point of the first and second switch tubes and a second connection point of the first and second diodes. The system further includes:

a first current sampling unit, the first current sampling unit and the first switch tube connected in series between the first parallel connection point and the first connection point, and the first current sampling unit configured to sample a current or an induced current flowing through the first switch tube when the first switch tube is turned on at the negative AC half cycle; or the first current sampling unit and the first diode connected in series between the first parallel connection point and the second connection point, and the first current sampling unit configured to sample a current or an induced current flowing through the first diode when the first switch tube is turned on at the negative AC half cycle;

a second current sampling unit, the second current sampling unit and the second switch tube connected in series between the second parallel connection point and the first connection point, and the second current sampling unit configured to sample a current or an induced current flowing through the second switch tube when the second switch tube is turned on at a positive AC half cycle; or the second current sampling unit and the second diode connected in series between the second parallel connection point and the second connection point, and the second current sampling unit configured to sample a current or an induced current flowing through the second diode when the second switch tube is turned on at the positive AC half cycle;

a third current sampling unit, the third current sampling unit and the load unit first connected in series and then connected in parallel between the first parallel connection point and the second parallel connection point, and the third current sampling unit configured to sample a current flowing through the load unit; and a control unit, connected to the first, second, and third current sampling units, the first switch tube, and the second switch tube, and the control unit configured to control the turn-on or turn-off of the first switch tube and the second switch tube according to current signals sampled by the first, second, and third current sampling units.

BRIEF DESCRIPTION OF THE DRAWINGS

One or more embodiments are exemplarily described with reference to pictures in corresponding attached drawings, and these exemplary descriptions are not intended to limit the embodiments. In the attached drawings, elements bearing the same reference numerals represent the same or similar elements, and unless otherwise stated, the pictures in the attached drawings are not intended to limit the scale.

DETAILED DESCRIPTION

To better understand the technical solution of the present disclosure, embodiments are described hereinbelow with reference to the accompanying drawings. It should be noted that, when an element is described to be "fixed" on another, it can be directly fixed on another element or there are one or more intervening elements positioned therebetween. Likewise, when an element is described to be "connected" to another, it can be directly connected to another element or there are one or more intervening elements positioned therebetween. The terms "vertical", "horizontal", "left", and "right" or the like used in the embodiments of the present disclosure are for the purpose of description.

Unless otherwise indicated, all the technical and scientific terms used in this specification have the same meaning as those of the technical field of the application to one of ordinary skilled in the art. The terminology used ill the embodiments of the present disclosure is for the purpose of describing particular embodiments only and is not intended to limit the present disclosure. The term "and/or" used in the specification includes one or more relevant items as well as arbitrary and all combinations thereof.

Embodiment 1

Figure 1A:
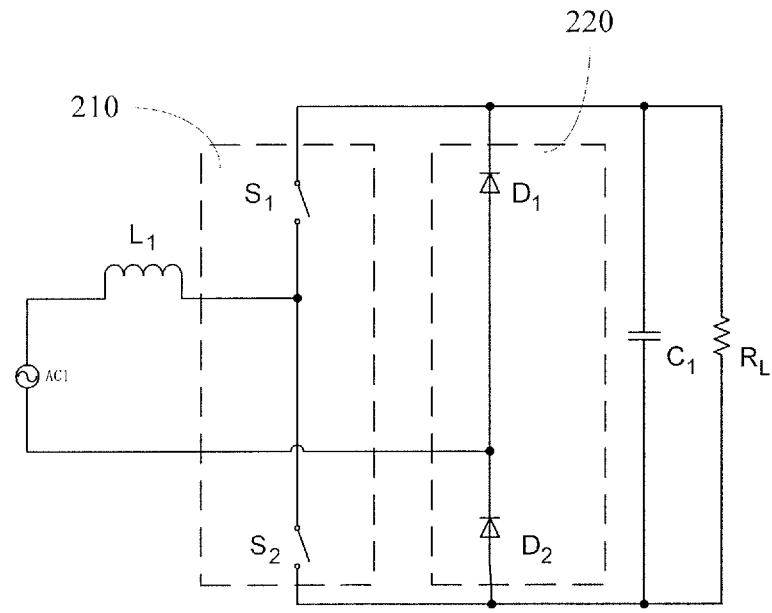
FIG. 1a is a schematic diagram of a Totem-Pole bridgeless circuit in the related art.
Figure 1B:
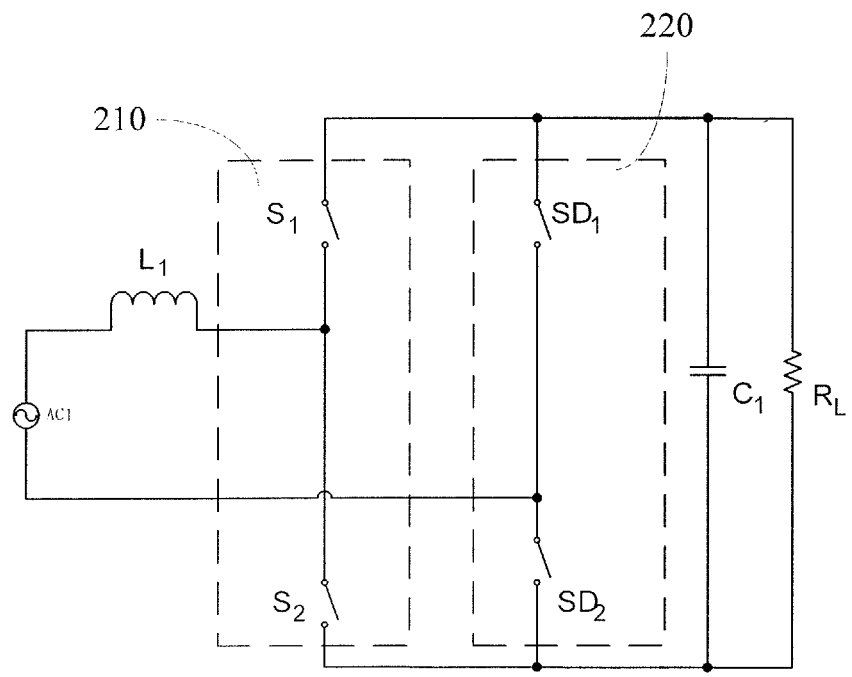
FIG. 1b is a schematic diagram of another Totem-Pole bridgeless circuit in the related art.
Figure 2:
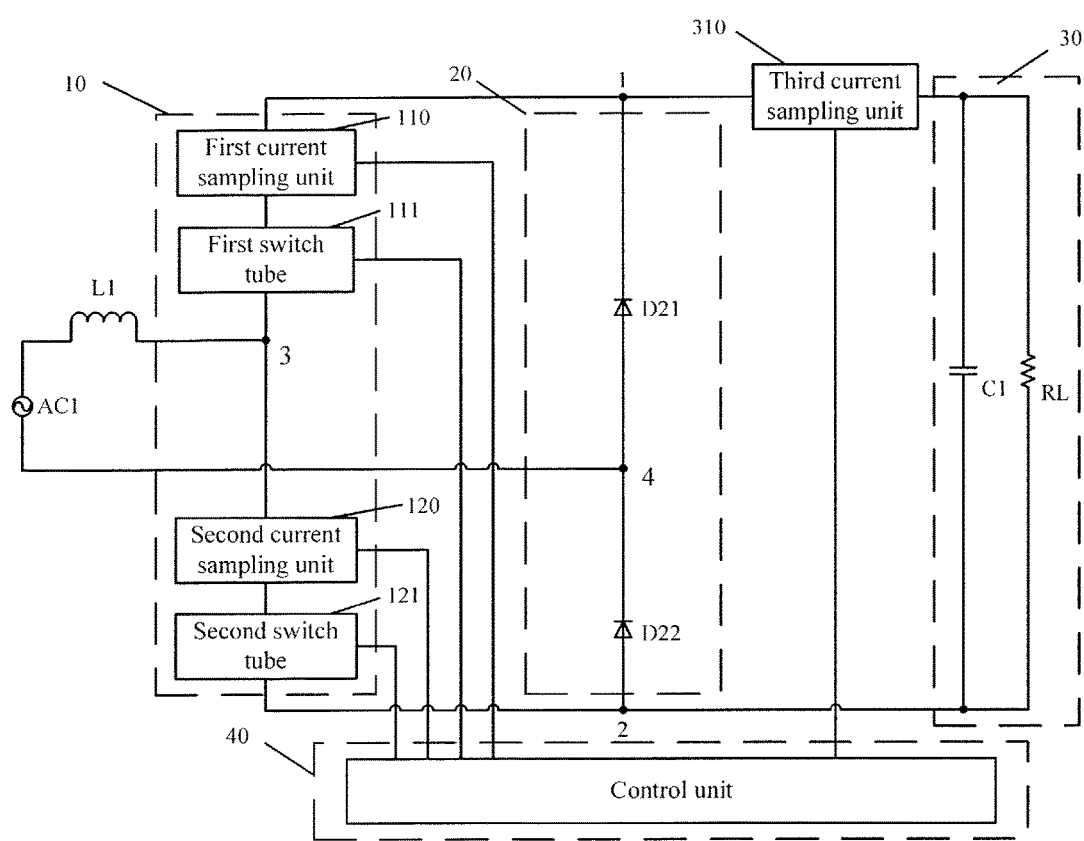
FIG. 2 is a schematic diagram of a system for sampling current of a Totem-Pole bridgeless circuit according to Embodiment 1 of the present disclosure.

As shown in FIG. 2, an embodiment of a system for sampling current includes a Totem-Pole bridgeless circuit which includes a first bridge arm unit 10, a second bridge arm unit 20, and a load unit 30 that are connected in parallel between a first parallel connection point 1 and a second parallel connection point 2; the first bridge arm unit 10 includes a first switch tube 111 and a second switch tube 121 which are connected in series in a same direction; the second bridge arm unit 20 includes a first diode D21 and a second diode D22 which are connected in series in a same direction; the load unit 30 includes a capacitor C1 and a load resistor RL which are connected in parallel; and a power supply AC1 and an inductor L1 are positioned between a first connection point 3 of the two switch tubes 111, 121 and a second connection point 4 of the two diodes D21, D22.

In the illustrated embodiment, the system further includes a first, a second, and a third current sampling units 110, 120, 310 and a control unit 40; the first current sampling unit 110 and the first switch tube 111 are connected in series between the first parallel connection point 1 and the first connection point 3, and the second current sampling unit 120 and the second switch tube 121 are connected in series between the second parallel connection point 2 and the first connection point 4; and the third current sampling unit 310 and the load unit 30 are connected in parallel between the first parallel connection point 1 and the second parallel connection point 2.

The first current sampling unit 110 is configured to sample a current or an induced current flowing through the first switch tube 111 when the first switch tube 111 is turned on at the negative AC half cycle. The second current sampling unit 120 is configured to sample a current or an induced current flowing through the second switch tube 121 when the second switch tube 121 is turned on at the positive AC half cycle. The third current sampling unit 310 is configured to sample a current flowing through the load unit 30.

The control unit 40 is connected to the first, second, and third current sampling units 110, 120, 310, the first switch tube 111, and the second switch tube 121. The control unit 40 is configured to control the turn-on or turn-off of the first switch tube 111 and the second switch tube 121 according to current signals sampled by the first, second, and third current sampling units 110, 120, 310.

At least one signal output end of each of the first current sampling unit 110, the second current sampling unit 120, and the third current sampling unit 310 is connected to the control input end of the control unit 40. The control output end of the control unit 40 is connected to the first switch tube 111 and the second switch tube 121. Thus, according to part or all of output signals sampled by the first current sampling unit 110, the second current sampling unit 120, and the third current sampling unit 310, the control unit 40 controls the turn-on or turn-off of the first switch tube 111 and the second switch tube 121.

When the alternating current input by the power supply AC1 is ill a positive half cycle, the second switch tube 121 is turned on and the first switch tube 111 is turned off, and thus the power supply AC1, the inductor L1, the second current sampling unit 120, the second switch tube 121, and the second diode D22 form an energy storage loop. Forward current flows through the second current sampling unit 120, the second current sampling unit 120 samples the flowing forward current signals, and the energy from the power supply AC1 is stored in the inductor L1. After the energy storage from the power supply AC1 to the inductor L1 is completed, the first switch tube 111 is turned on and the second switch tube 121 is turned off, and then the inductor L1, the first switch tube 111, the first current sampling unit 110, the third current sampling unit 310, the load unit 30, and the second diode D22 form a continuous current loop to release the energy of the inductor L1, as a result, reverse current flows through the first current sampling unit 110 but the first current sampling unit 110 does not sample the flowing reverse current signals, and the third current sampling unit 310 samples the flowing current.

When the alternating current input by the power supply AC1 is in a negative half cycle, the first switch tube 111 is turned on and the second switch tube 121 is turned off, and thus the power supply AC1, the first current sampling unit 110, the first switch tube 111, and the inductor L1, form an energy storage loop. Forward current flows through the first current sampling unit 110, the first current sampling unit 110 samples the flowing forward current signals, and the energy from the power supply AC1 is stored in the inductor L1. After the energy storage from the power supply AC1 to the inductor L1 is completed, the second switch tube 121 is turned on and the first switch tube 111 is turned off, and then the inductor L1, the first diode D21, the third current sampling unit 310, the load unit 30, the second switch tube 121, and the second current sampling unit 120, form a continuous current loop to release the energy of the inductor L1, as a result, reverse current flows through the second current sampling unit 120 but the second current sampling unit 120 does not sample the flowing reverse current signals, and the third current sampling unit 310 samples the flowing current.

In some exemplary embodiments, the control unit 40 is a microprocessor. The control method (not limited to) adopted by the control unit 40 is summarized as follows. When the alternating current input by the power supply AC1 is in the positive half cycle, at the initial stage, the control unit 40 turns the second switch tube 121 on and turns the first switch tube 111 off, and thus the power supply AC1, the inductor L1, the second current sampling unit 120, the second switch tube 121, and the second diode D22 form an energy storage loop. Forward current flows through the second current sampling unit 120, the second current sampling unit 120 samples the flowing forward current signals, and the energy from the power supply AC1 is stored in the inductor L1. When the peak value of the sampled forward current signals reaches a reference threshold value, the control unit 40 turns the first switch tube 111 on and turns the second switch tube 121 off, the energy storage from the power supply AC1 to the inductor L1 is completed, and then the energy stored in the inductor L1 begins to release. At this moment, the inductor L1, the first switch tube III, the first current sampling unit 110, the third current sampling unit 310, the load unit 30, and the second diode D22 form a continuous current loop to release the energy of the inductor L1, as a result, reverse current flows through the first current sampling unit 110, and the third current sampling unit 310 samples the flowing current. When the valley value of the current signals sampled by the third current sampling unit 310 reaches another reference threshold value, the control unit 40 turns the second switch tube 121 on and turns the first switch tube 111 off, thus reentering the energy storage stage.

When the alternating current input by the power supply AC1 is in the negative half cycle, at the initial stage, the control unit 40 turns the first switch tube 111 on and turns the second switch tube 121 off, and thus the power supply AC1, the first diode D21, the first current sampling unit 110, the first switch tube 111, and the inductor L1 form an energy storage loop. Forward current flows through the first current sampling unit 110, the first current sampling unit 110 samples the flowing forward current signals, and the energy from the power supply AC1 is stored in the inductor L1. When the peak value of the sampled forward current signals reaches a reference threshold value, the control unit 40 turns the second switch tube 121 on and turns the first switch tube 111 off, the energy storage from the power supply AC1 to the inductor L1 is completed, and then the energy stored in the inductor L1 begins to release. At this moment, the inductor L1, the first diode D21, the third current sampling unit 310, the load unit 30, the second switch tube 121, and the second current sampling unit 120 form a continuous current loop to release the energy of the inductor L1, as a result, reverse current flows through the second current sampling unit 120, and the third current sampling unit 310 samples the flowing current. When the valley value of the current signals sampled by the third current sampling unit 310 reaches another reference threshold value, the control unit 40 turns the first switch tube 111 on and turns the second switch tube 121 off, thus reentering the energy storage stage.

Based on the aforesaid control methods, the control unit 40 divides the charge-discharge cycle of the inductor L1 into a charge process and a discharge process. The current values collected by the first current sampling unit 110 and the second current sampling unit 120 are used to trigger the charge process, and the current values collected by the third current sampling unit 310 are used to trigger the discharge process, thus greatly simplifying the control process of the control unit 40, and the first switch tube 111 and the second switch tube 121 can be accurately controlled without the complex processing on the current data. The control method is a typical control method of the implementation mode in the present disclosure, and it is well-known to one of ordinary skilled in the art that, the first, second, and third current sampling units 110, 120, 310 can be arbitrarily combined to constitute other control schemes, e. g., the current values collected by the first current sampling unit 110 and the third current sampling unit 310 are used to trigger the charge process, and the current values collected by the second current sampling unit 120 are used to trigger the discharge process. The control schemes are specific applications of the current values collected by the first, second, and third current sampling units 110, 120, 310 in this illustrated embodiments, and any transformation thereof based on simple mathematical combinations belongs to a simple transformation of the control method.

In this illustrated embodiment, the first switch tube 111 and the second switch tube 121 are (not limited to) a metal-oxide-semiconductor field effect transistor (MOSFET) or a bipolar junction transistor (BJT) or the like.

In some alternative embodiments, the first diode D21 and the second diode D22 can each be replaced by a switch tube.

Embodiment 2

Figure 3:
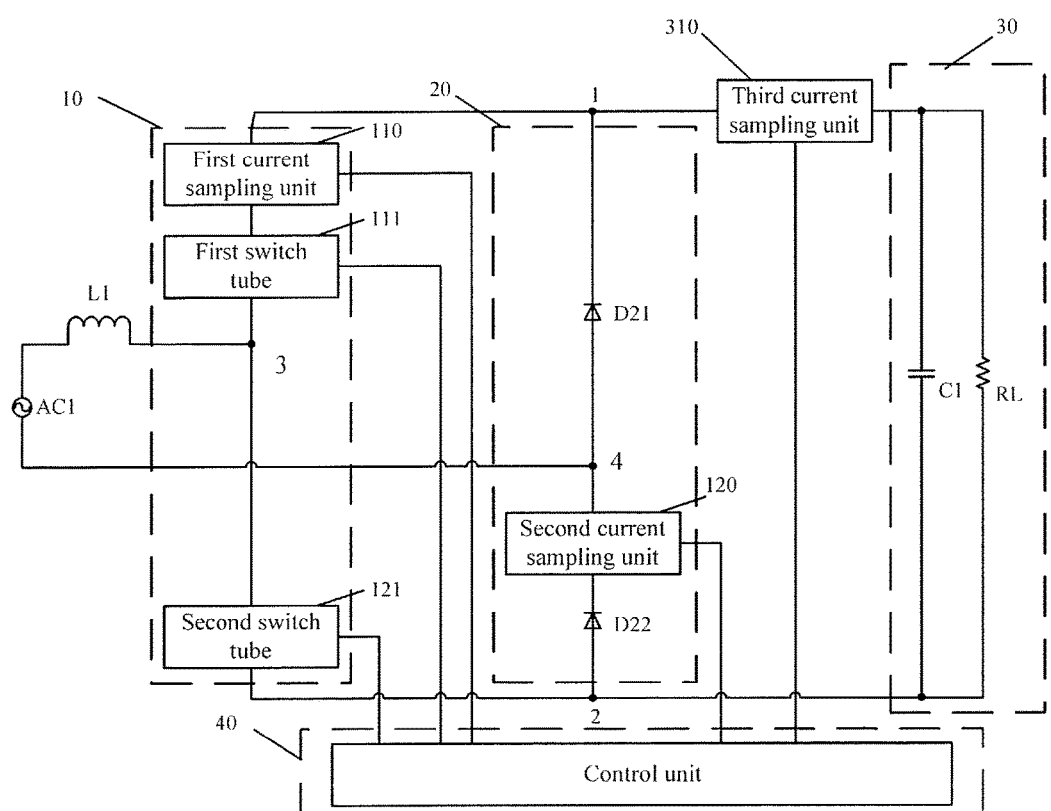
FIG. 3 is a schematic diagram of a system for sampling current of a Totem-Pole bridgeless circuit according to Embodiment 2 of the present disclosure.

As shown in FIG. 3, an embodiment of a system for sampling current includes a Totem-Pole bridgeless circuit which includes a first bridge arm unit 10, a second bridge arm unit 20, and a load unit 30 that are connected in parallel between a first parallel connection point 1 and a second parallel connection point 2; the first bridge arm unit 10 includes a first switch tube 111 and a second switch tube 121 which are connected in series in a same direction; the second bridge arm unit includes a first diode D21 and a second diode D22 which are connected in series in a same direction; the load unit 30 includes a capacitor C1 and a load resistor RL which are connected in parallel; and a power supply AC1 and an inductor L1 are positioned between a first connection point 3 of the two switch tubes 111, 121 and a second connection point 4 of the two diodes D21, D22.

In this illustrated embodiment, the system further includes a first, a second, and a third current sampling units 110, 120, 310 and a control unit 40; the first current sampling unit 110 and the first switch tube 111 are connected in series between the first parallel connection point 1 and the first connection point 3, and the second current sampling unit 120 and the second diode D22 are connected in series between the second parallel connection point 2 and the second connection point 4; and the third current sampling unit 310 and the load unit 30 are connected in parallel between the first parallel connection point 1 and the second parallel connection point 2.

The first current sampling unit 110 is configured to sample a current or an induced current flowing through the first switch tube 111 when the first switch tube 111 is turned on at the negative AC cycle. The second current sampling unit 120 is configured to sample a current or an induced current flowing through the second diode D22 when the second switch tube 121 is turned on at the positive AC cycle. The third current sampling unit 310 is configured to sample a current flowing through the load unit 30.

The control unit 40 is connected to the first, second and third current sampling units 110, 120, 310, the first switch tube 111, and the second switch tube 121. The control unit 40 is configured to control the turn-on or turn-off of the first switch tube 111 and the second switch tube 121 according to current signals sampled by the first, second and third current sampling units 110, 120, 310.

At least one signal output end of each of the first current sampling unit 110, the second current sampling unit 120, and the third current sampling unit 310 is connected to the control input end of the control unit 40. The control output end of the control unit 40 is connected to the first switch tube 111 and the second switch tube 121. Thus, according to part or all of output signals sampled by the first current sampling unit 110, the second current sampling unit 120, and the third current sampling unit 310, the control unit 40 controls the turn-on or turn-off of the first switch tube 111 and the second switch tube 121.

When the alternating current input by the power supply AC1 is in a positive half cycle, the second switch tube 121 is turned on and the first switch tube 111 is turned off, and thus the power supply AC1, the inductor L1, the second switch tube 121, the second diode D22, and the second current sampling unit 120 form an energy storage loop. Forward current flows through the second current sampling unit 120, the second current sampling unit 120 samples the flowing forward current signals, and the energy from the power supply AC1 is stored in the inductor L1. After the energy storage from the power supply AC1 to the inductor L1 is completed, the first switch tube 111 is turned on and the second switch tube 121 is turned off, and then the inductor L1, the first switch tube 111, the first current sampling unit 110, the third current sampling unit 310, the load unit 30, the second diode D22, and the second current sampling unit 120 form a continuous current loop to release the energy of the inductor L1, as a result, reverse current flows through the first current sampling unit 110 and the second current sampling unit 120, and the third current sampling unit 310 samples the flowing current.

When the alternating current input by the power supply AC1 is in a negative half cycle, the first switch tube 111 is turned on and the second switch tube 121 is turned off, and thus the inductor L1, the power supply AC1, the first diode D21, the first current sampling unit 110, and the first switch tube 111 form an energy storage loop. Forward current flows through the first current sampling unit 110, the first current sampling unit 110 samples the flowing forward current signals, and the energy from the power supply AC1 is stored in the inductor L1. After the energy storage from the power supply AC1 to the inductor L1 is completed, the second switch tube 121 is turned on and the first switch tube 111 is turned off, and then the inductor L1, the power supply AC1, the first diode D21, the third current sampling unit 310, the load unit 30, and the second switch tube 121 form a continuous current loop to release the energy of the inductor L1, as a result, the third current sampling unit 310 samples the flowing current.

In this illustrated embodiment, the first switch tube 111 and the second switch tube 121 are each (not limited to) a metal-oxide-semiconductor field effect transistor (MOSFET) or a bipolar junction transistor (BJT) or the like.

In some alternative embodiments, the first diode D21 and the second diode D22 can each be replaced by a switch tube.

Embodiment 3

Figure 4:
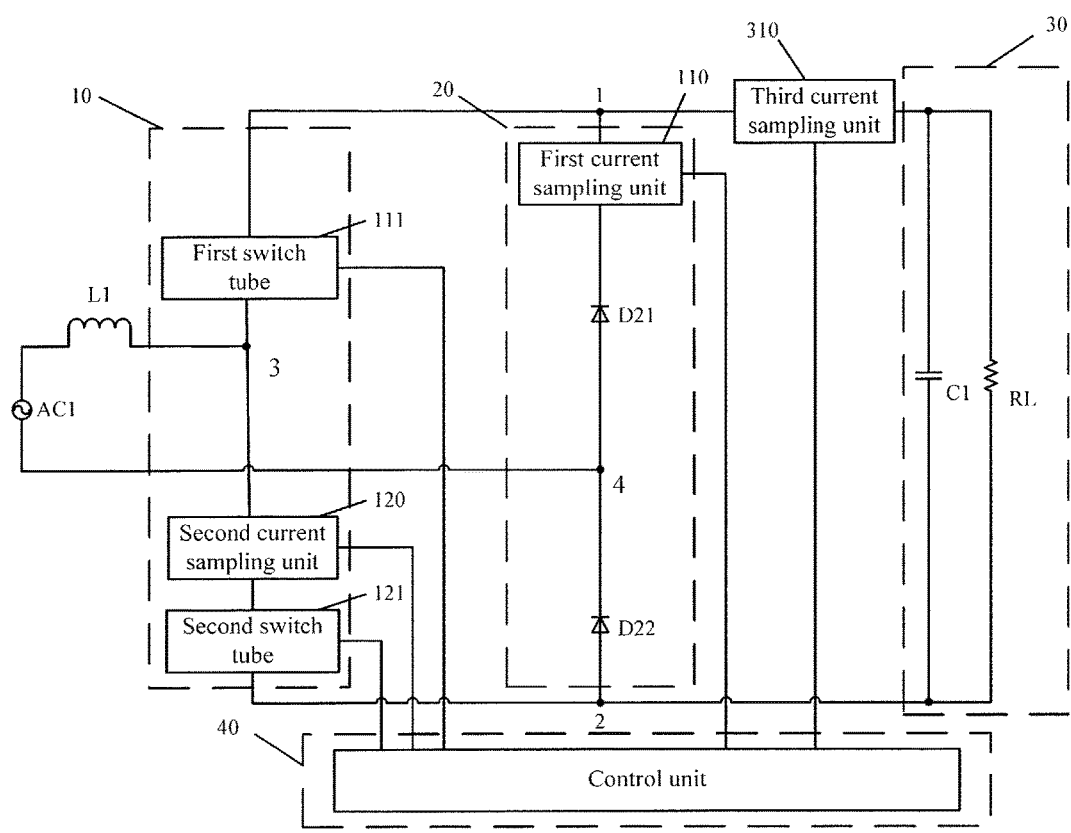
FIG. 4 is a schematic diagram of a system for sampling current of a Totem-Pole bridgeless circuit according to Embodiment 3 of the present disclosure.

As shown in FIG. 4, an embodiment of a system for sampling current includes a Totem-Pole bridgeless circuit which includes a first bridge arm unit 10, a second bridge arm unit 20, and a load unit 30 that are connected in parallel between a first parallel connection point 1 and a second parallel connection point 2; the first bridge arm unit 10 includes a first switch tube 111 and a second switch tube 121 which are connected in series in a same direction; the second bridge arm unit 20 includes a first diode D21 and a second diode D22 which are connected in series in a same direction; the load unit 30 includes a capacitor C1 and a load resistor RL which are connected in parallel; and a power supply AC1 and an inductor L1 are positioned between a first connection point 3 of the two switch tubes 111, 121 and a second connection point 4 of the two diodes D21, D22.

In this illustrated embodiment, the system further includes a first, a second, and a third current sampling units 110, 120, 310 and a control unit 40; the first current sampling unit 110 and the first diode D21 are connected in series between the first parallel connection point 1 and the second connection point 4, and the second current sampling unit 120 and the second switch tube 121 are connected in series between the second parallel connection point 2 and the first connection point 3; and the third current sampling unit 310 and the load unit 40 are connected in parallel between the first parallel connection point 1 and the second parallel connection point 2.

The first current sampling unit 110 is configured to sample a current or an induced current flowing through the first diode D21 when the first switch tube 111 is turned on at the negative AC half cycle. The second current sampling unit 120 is configured to sample a current or an induced current flowing through the second switch tube 121 when the second switch tube 121 is turned on at the positive AC half cycle. The third current sampling unit 310 is configured to sample a current flowing through the load unit 30.

The control unit 40 is connected to the first, second, and third current sampling units 110, 120, 310, the first switch tube 111, and the second switch tube 121. The control unit 40 is configured to control the turn-on or turn-off of the first switch tube 111 and the second switch tube 121 according to current signals sampled by the three current sampling units 110, 120, 310.

At least one signal output end of each of the first current sampling unit 110, the second current sampling unit 120, and the third current sampling unit 310 is connected to the control input end of the control unit 40. The control output end of the control unit 40 is connected to the first switch tube 111 and the second switch tube 121. Thus, according to part or all of output signals sampled by the first current sampling unit 110, the second current sampling unit 120, and the third current sampling unit 310, the control unit 40 controls the turn-on or turn-off of the first switch tube 111 and the second switch tube 121.

When the alternating current input by the power supply AC1 is in the positive half cycle, the second switch tube 121 is turned on and the first switch tube 111 is turned off and thus the power supply AC1, the inductor L1, the second current sampling unit 120, the second switch tube 121, and the second diode D22 form an energy storage loop. Forward current flows through the second current sampling unit 120, the second current sampling unit 120 samples the flowing forward current signals, and the energy from the power supply AC1 is stored in the inductor After the energy storage from the power supply AC1 to the inductor L1 is completed, the first switch tube 111 is turned on and the second switch tube 121 is turned off, and then the inductor L1, the first switch tube 111, the third current sampling unit 310, the load unit 30, and the second diode D22 form a continuous current loop to release the energy of the inductor L1, as a result, the third current sampling unit 310 samples the flowing current.

When the alternating current input by the power supply AC1 is in the negative half cycle, the first switch tube 111 is turned on and the second switch tube 121 is turned off, and thus the power supply AC1, the first diode D21, the first current sampling unit 110, the first switch tube 111, and the inductor L1 form an energy storage loop. Forward current flows through the first current sampling unit 110, the first current sampling unit 110 samples the flowing forward current signals, and the energy from the power supply AC1 is stored in the inductor L1. After the energy storage from the power supply AC1 to the inductor L1 is completed, the second switch tube 121 is turned on and the first switch tube 111 is turned off, and then the inductor L1, the first diode D21, the first current sampling unit 110, the third current sampling unit 310, the load unit 30, the second switch tube 121, and the second current sampling unit 120 form a continuous current loop to release the energy of the inductor L1, as a result, reverse current flows through the second current sampling unit 120, and the third current sampling unit 310 samples the flowing current.

In this illustrated embodiment, the first switch tube 111 and the second switch tube 121 are each (not limited to) a metal-oxide-semiconductor field effect transistor (MOS-FET) or a bipolar junction transistor (BJT) or the like.

In some alternative embodiments, the first diode D21 and the second diode D22 can each be replaced by a switch tube.

Embodiment 4

Figure 5:
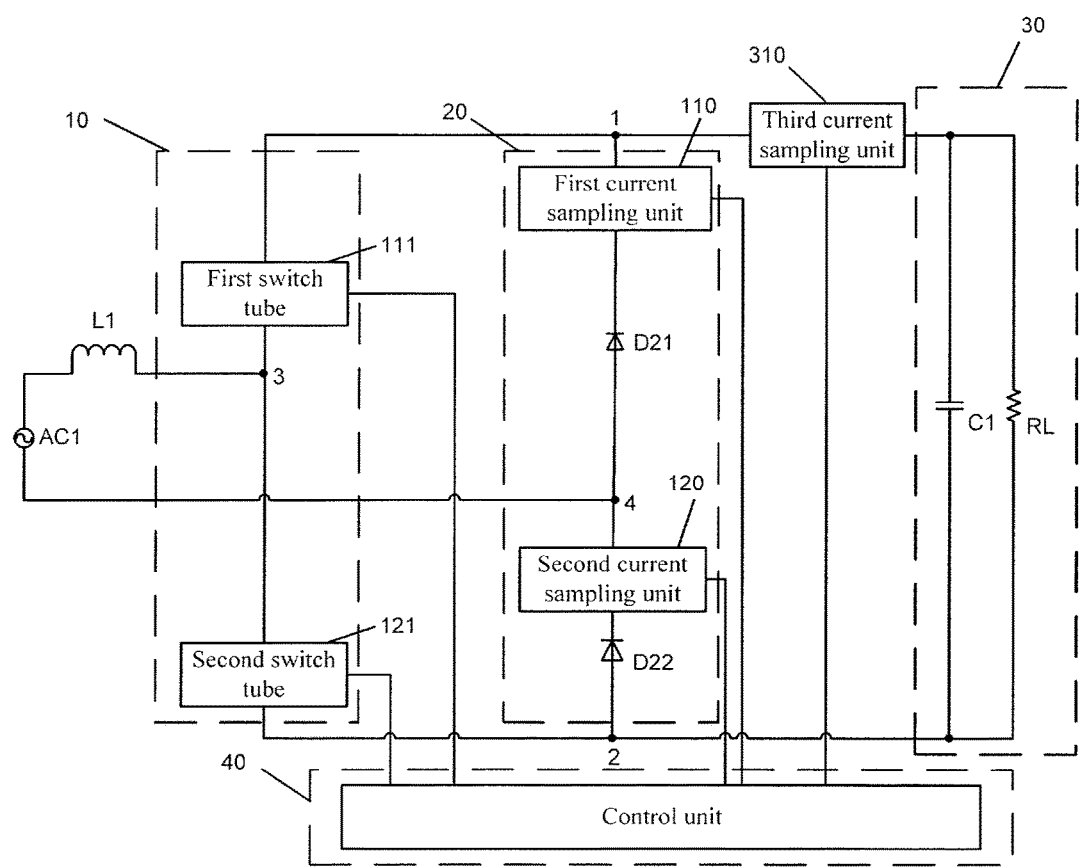
FIG. 5 is a schematic diagram of a system for sampling current of a Totem-Pole bridgeless circuit according to Embodiment 4 of the present disclosure.

As shown in FIG. 5, an embodiment of a system for sampling current includes a Totem-Pole bridgeless circuit which includes a first bridge arm unit 10, a second bridge arm unit 20, and a load unit 30 that are connected in parallel between a first parallel connection point 1 and a second parallel connection point 2; the first bridge arm unit 10 includes a first switch tube 111 and a second switch tube 121 which are connected in series in a same direction; the second bridge arm unit 20 includes a first diode D21 and a second diode D22 which are connected in series in a same direction; the load unit 30 includes a capacitor C1 and a load resistor RL which are connected in parallel; and a power supply AC1 and an inductor L1 are positioned between a first connection point 3 of the two switch tubes 111, 121 and a second connection point 4 of the two diodes D21, D22.

In this illustrated embodiment, the system further includes a first, a second, and a third current sampling units 110, 120, 310 and a control unit 40; the first current sampling unit 110 and the first diode D21 are connected in series between the first parallel connection point 1 and the second connection point 4, and the second current sampling unit 120 and the second diode D22 are connected in series between the second parallel connection point 2 and the second connection point 4; and the third current sampling unit 310 and the load unit 30 are connected in parallel between the first parallel connection point 1 and the second parallel connection point 2.

The first current sampling unit 110 is configured to sample a current or an induced current flowing through the first diode D21 when the first switch tube 111 is turned on at negative AC half cycle. The second current sampling unit 120 is configured to sample a current or an induced current flowing through the second diode D22 when the second switch tube 121 is turned at positive AC half cycle. The third current sampling unit 310 is configured to sample a current flowing through the load unit 30.

The control unit 40 is connected to the first, second, and third current sampling units 110, 120, 310, the first switch tube 111, and the second switch tube 121. The control unit 40 is configured to control the turn-on or turn-off of the first switch tube 111 and the second switch tube 121 according to current signals sampled by the three current sampling units 110, 120, 310.

At least one signal output end of each of the first current sampling unit 110, the second current sampling unit 120, and the third current sampling unit 310 is connected to the control input end of the control unit 40. The control output end of the control unit 40 is connected to the first switch tube 111 and the second switch tube 121. Thus, according to part or all of output signals sampled by the first current sampling unit 110, the second current sampling unit 120, and the third current sampling unit 310, the control unit 40 controls the turn-on or turn-off of the first switch tube 11 and the second switch tube 120.

When the alternating current input by the power supply AC1 is in a positive half cycle, the second switch tube 121 is turned on and the first switch tube 111 is turned off, and thus the power supply AC1, the inductor L1, the second switch tube 121, the second diode D22, and the second current sampling unit 120 form an energy storage loop. Forward current flows through the second current sampling unit 120, the second current sampling unit 120 samples the flowing forward current signals, and the energy from the power supply AC1 is stored in the inductor L1. After the energy storage from the power supply AC1 to the inductor L1 is completed, the first switch tube 111 is turned on and the second switch tube 121 is turned off, and then the inductor L1, the first switch tube 111, the third current sampling unit 310, the load unit 30, the second diode D22, and the second current sampling unit 120 form a continuous current loop to release the energy of the inductor L1, as a result, and the third current sampling unit 310 samples the flowing current.

When the alternating current input by the power supply AC1 is in a negative half cycle, the first switch tube 111 is turned on and the second switch tube 121 is turned off, and thus the power supply AC1, the first diode D21, the first current sampling unit 110, the first switch tube 111, and the inductor L1 form an energy storage loop. Forward current flows through the first current sampling unit 110, the first current sampling unit 110 samples the flowing forward current signals, and the energy from the power supply AC1 is stored in the inductor L1. After the energy storage from the power supply AC1 to the inductor L1 is completed, the second switch tube 121 is turned on and the first switch tube 111 is turned off, and then the inductor L1, the first diode D21, the first current sampling unit 110, the third current sampling unit 310, the load unit 30, and the second switch tube 121 form a continuous current loop to release the energy of the inductor L1, as a result, the third current sampling unit 310 samples the flowing current.

In this illustrated embodiment, the first switch tube 111 and the second switch tube 121 are each (not limited to) a metal-oxide-semiconductor field effect transistor (MOSFET) or a bipolar junction transistor (BJT) or the like.

In some alternative embodiments, the first diode D21 and the second diode D22 can each be replaced by a switch tube.

Embodiment 5

Figure 6:
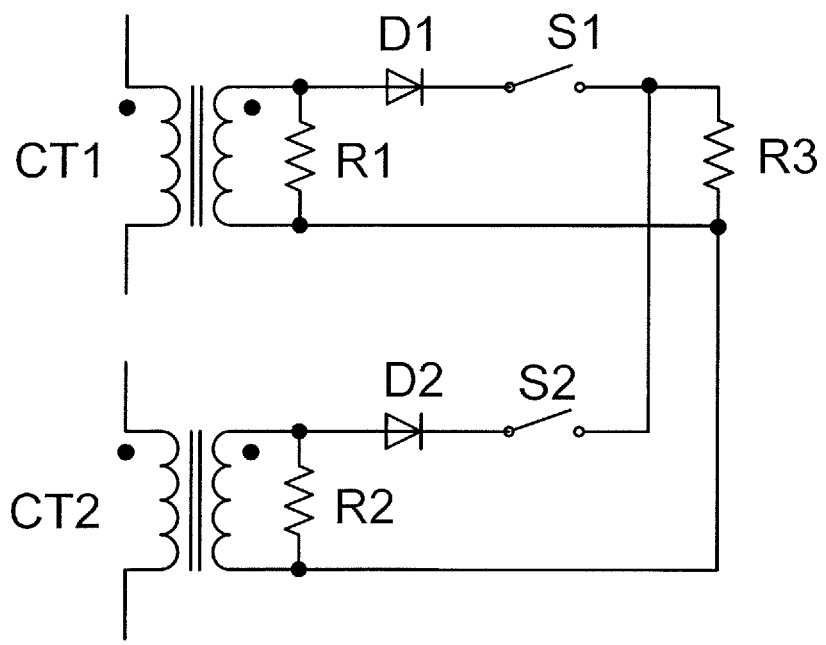
FIG. 6 is a diagram of a first circuit for sampling current according to an embodiment of the present disclosure.

An embodiment of a first circuit for sampling current is shown in FIG. 6. The first circuit for sampling current is applied in the systems for sampling current in Embodiments 1-4. In some exemplary embodiments, the first current sampling unit 110 and the second current sampling unit 120 are achieved by using the first circuit for sampling current, i.e., the first circuit for sampling current includes: the first current sampling unit 110 and the second current sampling unit 120, and the first current sampling unit 110 and the second current sampling unit 120 shares a common current sampling resistor R3.

The first current sampling unit 110 includes: a first current transformer CT1, a first reset resistor R1, a first diode D1, and a first sampling switch S1; the first current transformer CT1 includes a primary winding and a secondary winding. The secondary winding of the first current transformer CT1 and the first reset resistor R1 are connected in parallel. The cathode of the first diode D1 is connected to the first sampling switch S1, and the anode of the first diode D1 is connected to one end of the secondary winding of the first current transformer CT1 and one end of the first reset resistor R1. The first sampling switch S1 and the current sampling resistor R3 are connected in series. The other end of the secondary winding of the first current transformer CT1 and the other end of the first reset resistor R1 are connected to the other end of the current sampling resistor R3. The primary winding of the first current transformer CT1 and the first switch tube 111 are connected in series between the first parallel connection point 1 and the first connection point 3 when the first circuit for sampling current is applied in the system of Embodiment 1 of FIG. 2 or Embodiment 2 of FIG. 3; or the primary winding of the first current transformer CT1 and the first diode D21 are connected in series between the first parallel connection point 1 and the second connection point 4 when the first circuit for sampling current is applied in the system of Embodiment 3 of FIG. 4 or Embodiment 4 of FIG. 5. Switching sequences of the first sampling switch S1 and the first switch tube 111 are the same as each other or corresponding to each other at the negative AC half cycle.

The second current sampling unit 120 includes: a second current transformer CT2, a second reset resistor R2, a second diode D2, and a second sampling switch S2; the second current transformer CT2 includes a primary winding and a secondary winding. The secondary winding of the second current transformer CT2 and the second reset resistor R2 are connected in parallel. The cathode of the second diode D2 is connected to the second sampling switch S2, and the anode of the second diode D2 is connected to one end of the parallel connection point of the secondary winding of the second current transformer CT2 and one end of the second reset resistor R2. The second sampling switch S2 and the current sampling resistor R3 are connected in series. The other end of the parallel connection point of the secondary winding of the second current transformer CT2 and the other end of the second reset resistor R2 are connected to the other end of the current sampling resistor R3. The primary winding of the second current transformer CT2 and the second switch tube 121 are connected in series between the second parallel connection point 2 and the first connection point 3 when the first circuit for sampling current is applied in the system of Embodiment 1 of FIG. 2 or Embodiment 3 of FIG. 4; or the primary winding of the second current transformer CT2 and the second diode D22 are connected in series between the second parallel connection point 2 and the second connection point 4 when the first circuit for sampling current is applied in the system of Embodiment 2 of FIG. 3 or Embodiment 4 of FIG. 5. Switching sequences of the second sampling switch S2 and the second switch tube 121 are the same as each other or corresponding to each other at the positive AC half cycle.

In this illustrated embodiment, the current sampling resistor R3 is shared by the first and the second current sampling units 110, 120. The current sampling resistor R3 is connected to the control unit 40 when the first circuit for sampling current is applied in the system of Embodiments 1-4. In other alternative embodiments, the first current sampling unit 110 and the second current sampling unit do not share a current sampling resistor, and each employs an independent current sampling resistor.

Figure 6A:
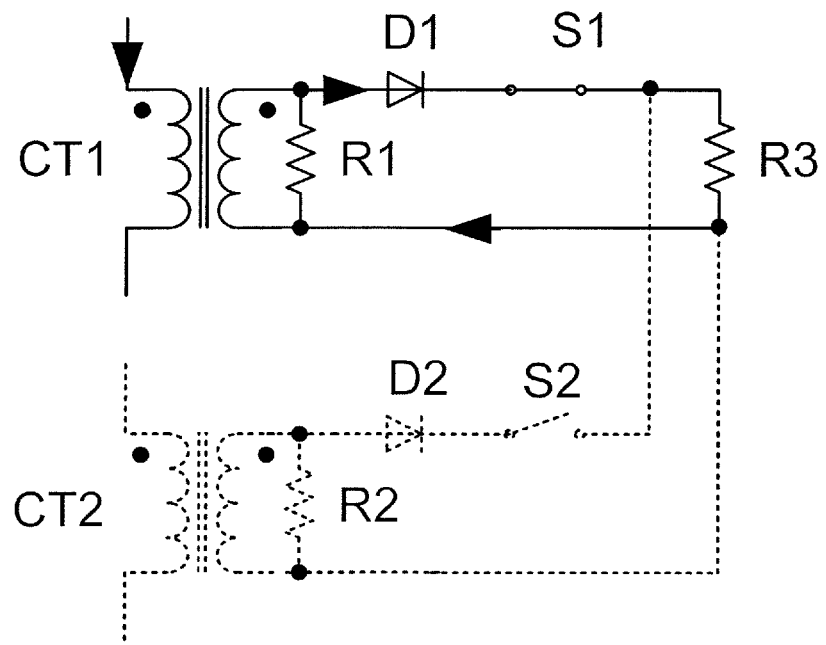
FIG. 6a is a schematic diagram illustrating a forward current of the first circuit for sampling current when sampling according to some embodiments of the present disclosure.
Figure 6B:
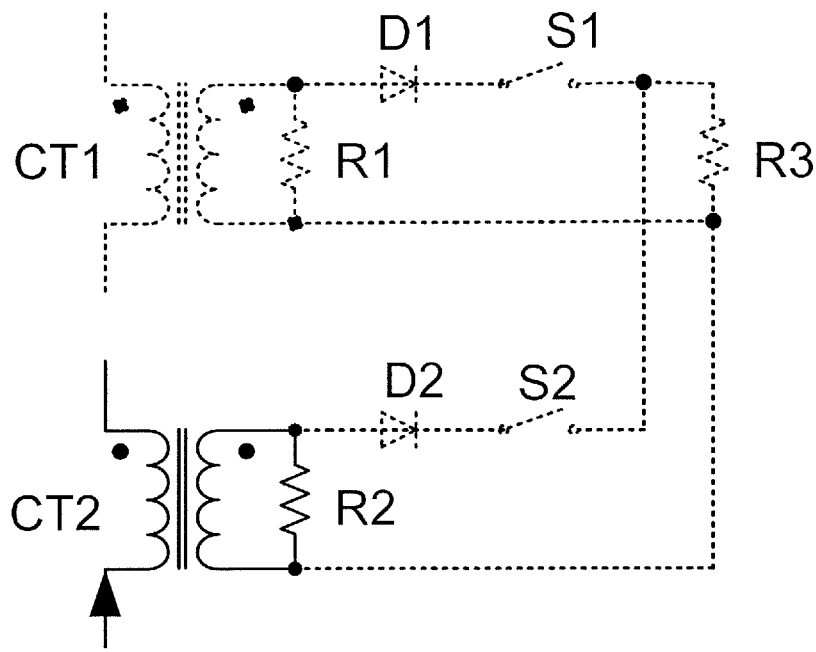
FIG. 6b is a schematic diagram illustrating a reset state of the first circuit for sampling current according to some embodiments of the present disclosure.
Figure 6C:
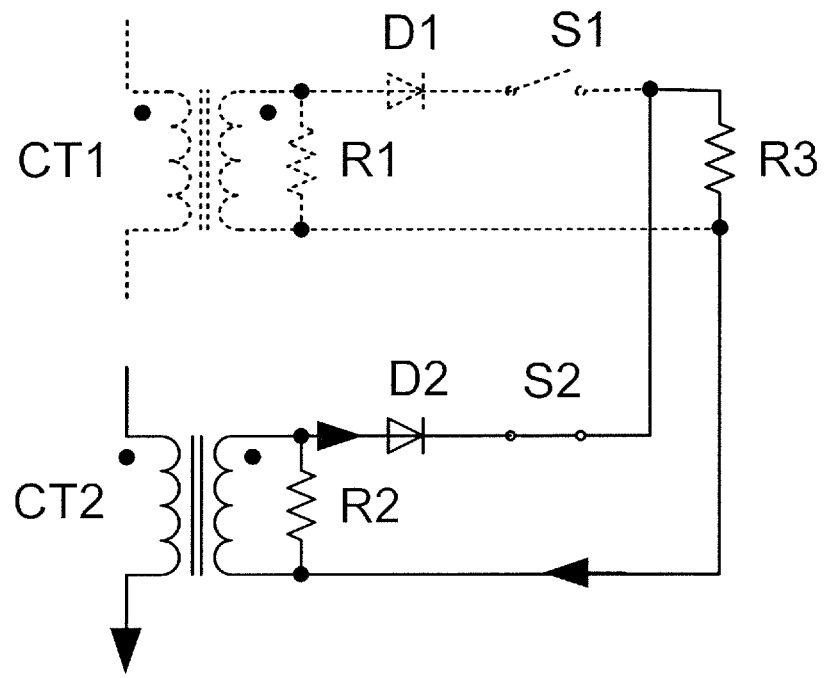
FIG. 6c is another schematic diagram illustrating a forward current of the first circuit for sampling current when sampling according to some embodiments of the present disclosure.
Figure 6D:
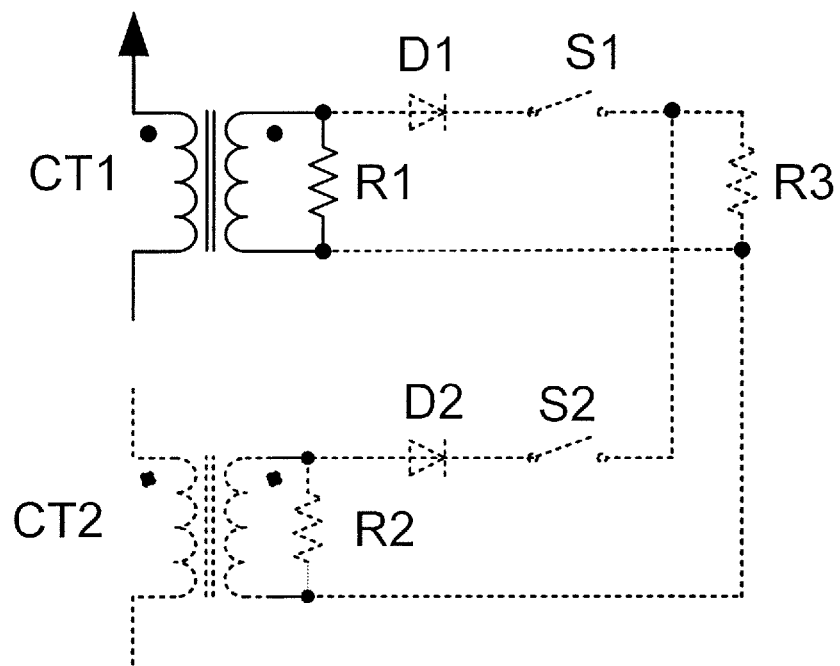
FIG. 6d is another schematic diagram illustrating a reset state of the first circuit for sampling current according to some embodiments of the present disclosure.

FIG. 6a and FIG. 6b shows the working state of the first circuit during the negative AC half cycle. FIG. 6a shows a working state of the first circuit for sampling current. When forward current flows through the primary winding of the first current transformer CT1 and the first sampling switch S1 is turned on at the negative AC half cycle, the forward current also flows through the secondary winding of the first current transformer CT1. As a result, the secondary winding of the first current transformer CT1, the first diode D1, the first sampling switch S1, and the current sampling resistor R3 form an energy storage loop to sample the forward current signal, as shown in the solid line of FIG. 6a. As shown in FIG. 6b, when the first sampling switch S1 is turned off, the secondary winding of the second current transformer CT2 and the first reset resistor R2 form a reset loop, as shown in the solid line of FIG. 6b. FIG. 6c and FIG. 6d shows the working state of the first circuit during the positive AC half cycle. As shown in FIG. 6c, when forward current flows through the primary winding of the second current transformer CT2 and the second sampling switch S2 is turned on at the positive AC half cycle, the forward current also flows through the secondary winding of the second current transformer CT2. As a result, the secondary winding of the second current transformer CT2, the second diode D2, the second sampling switch S2, and the current sampling resistor R3 form an energy storage loop to sample the forward current signal, as shown in the solid line of FIG. 6c. As shown in FIG. 6d, when the second sampling switch S2 is turned off, the secondary winding of the first current transformer CT1 and the first reset resistor R1 form a reset loop, as shown in the solid line of FIG. 6d.

Figure 8:
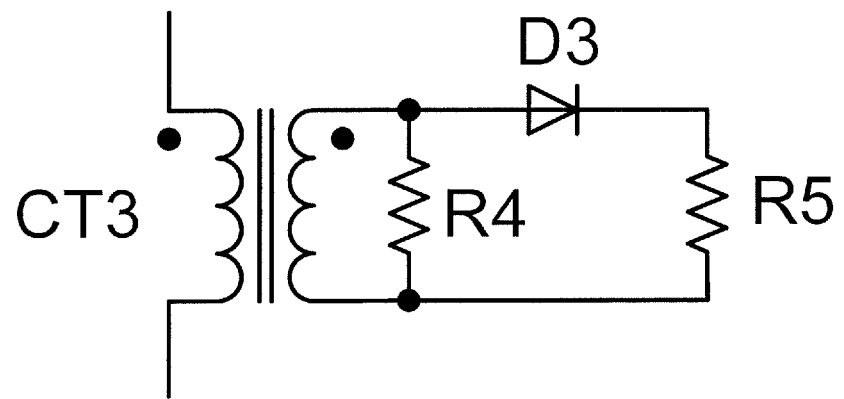
FIG. 8 is a diagram of a third circuit for sampling current according to an embodiment of the present disclosure.

An embodiment of a third circuit for sampling current is shown in FIG. 8. The third current sampling unit 310 is achieved by applying the third circuit for sampling current. The third circuit for sampling current includes: a third current transformer CT3, a third reset resistor R4, a diode D3, and a current sampling resistor R5. The third reset resistor R4 and the secondary winding of the third current transformer CT3 are connected in parallel. The diode D3 and the current sampling resistor R5 are connected in series between two ends of the third reset resistor R4. The anode of the diode D3 is connected to one end of the third reset resistor R4. The primary winding of the third current transformer CT3 and the load unit 30 are connected in series between the first parallel connection point 1 and the second parallel connection point 2 and the current sampling resistor R5 is connected to the control unit 40 when the third circuit is applied in the system of Embodiments 1-4.

Figure 8A:
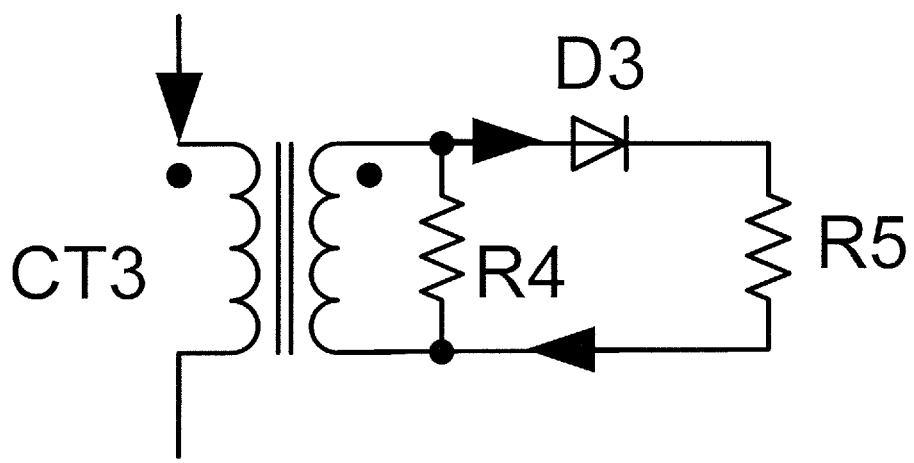
FIG. 8a is a schematic diagram illustrating a sampling state of the third circuit for sampling current according to some embodiments of the present disclosure.
Figure 8B:
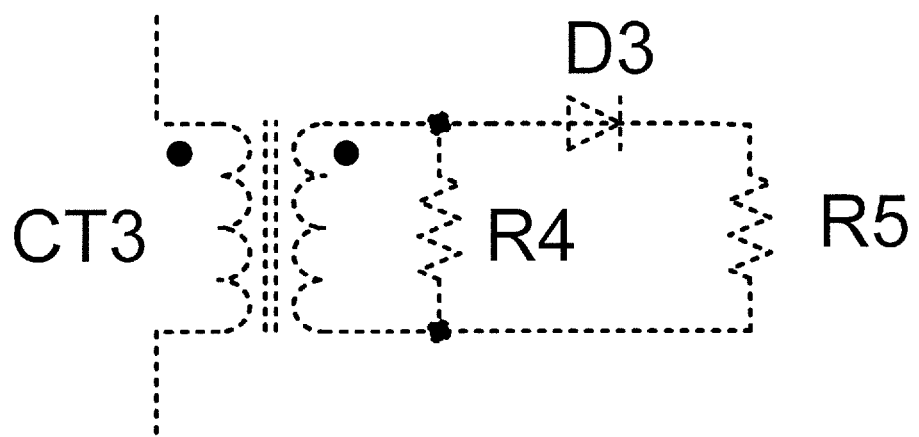
FIG. 8b is a schematic diagram illustrating a reset state of the third circuit for sampling current according to some embodiments of the present disclosure.

As shown in FIG. 8a, when the signal from the output end of the third current transformer CT3 enters the anode of the diode D3, the current flows through the current sampling resistor R5. As shown in FIG. 8b, when the signal from the output end of the third current transformer CT3 enters the cathode of the diode D3, no current flows through the current sampling resistor R5.

In this illustrated embodiments, the reset resistors R1 and R2 can each be replaced by a voltage-regulator tube (not limited to the tube).

In this illustrated embodiments, the first switch S1 and the second switch S2 are each (not limited to) a metal-oxide-semiconductor field effect transistor (MOSFET) or a bipolar junction transistor (BJT) or the like.

Embodiment 6

Figure 7:
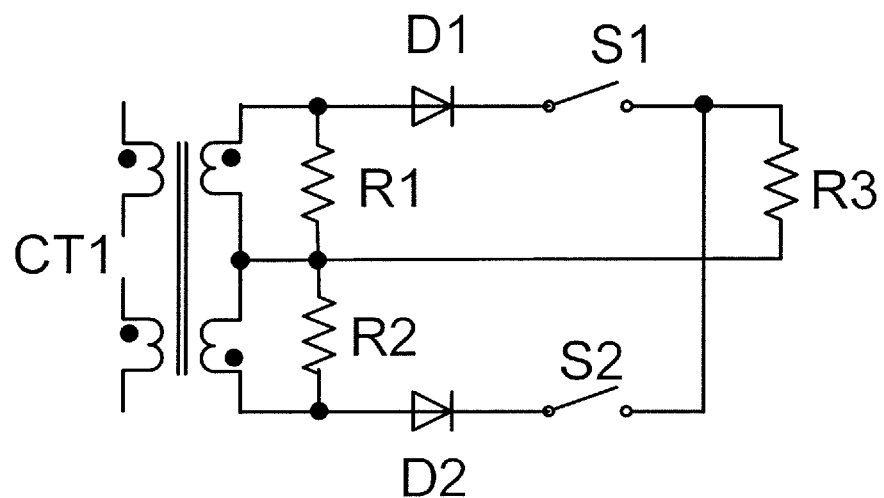
FIG. 7 is a diagram of a second circuit for sampling current according to an embodiment of the present disclosure.

An embodiment of a second circuit for sampling current is shown in FIG. 7. The second circuit for sampling current is applied in the systems for sampling current in Embodiments 1-4. In some exemplary embodiments, the first current sampling unit 110 and the second current sampling unit 120 are achieved by using the second circuit for sampling current, i.e., the second circuit for sampling current includes: the first current sampling unit 110 and the second current sampling unit 120 which share a common current transformer CT1, and a shared current sampling resistor R3.

The first current sampling unit 110 includes: a first primary winding of the current transformer CT1, a first secondary winding of the current transformer CT1, a first reset resistor R1, a first diode D1, and a first sampling switch S1. The first secondary winding of the current transformer CT1 and the first reset resistor R1 are connected in parallel. The cathode of the first diode D1 is connected to the first sampling switch S1, and the anode of the first diode D1 is connected to one end of the parallel connection point of the first secondary winding of the current transformer CT1 and the first reset resistor R1. The first sampling switch S1 and the current sampling resistor R3 are connected in series. The other end of the second parallel connection point of the first secondary winding of the current transformer CT1 and the first reset resistor R1 are connected to the other end of the current sampling resistor R3. The first primary winding of the current transformer CT1 and the first switch tube 111 are connected in series between the first parallel connection point 1 and the first connection point 3 when the second circuit for sampling current is applied in the system of Embodiment 1 of FIG. 2 or Embodiment 2 of FIG. 3; or the first primary winding of the current transformer CT1 and the first diode D21 are connected in series between the first parallel connection point 1 and the second connection point 4 when the second circuit for sampling current is applied in the system of Embodiment 3 of FIG. 4 or Embodiment 4 of FIG. 5. Switching sequences of the first sampling switch S1 and the first switch tube 111 are the same as each other or corresponding to each other at the negative AC half cycle.

The second current sampling unit 120 includes: a second primary winding of the current transformer CT1, a second secondary winding of the current transformer CT1, a second reset resistor R2, a second diode D2, and a second sampling switch S2. The second secondary winding of the current transformer CT1 and the second reset resistor R2 are connected in parallel. The cathode of the second diode D2 is connected to the second sampling switch S2, and the anode of the second diode D2 is connected to a parallel connection point of the second secondary winding of the current transformer CT1 and the second reset resistor R2. The second sampling switch S2 and the current sampling resistor R3 are connected in series. The second primary winding of the current transformer CT1 and the second switch tube 121 are connected in series between the second parallel connection point 2 and the first connection point 3 when the second circuit for sampling current is applied in the system of Embodiment 1 of FIG. 2 or Embodiment 3 of FIG. 4; or the second primary winding of the current transformer CT1 and the second diode D22 are connected in series between the second parallel connection point 2 and the second connection point 4 when the second circuit for sampling current is applied in the system of Embodiment 2 of FIG. 3 or Embodiment 4 of FIG. 5. Switching sequences of the second sampling switch S2 and the second switch tube 121 are the same as each other or corresponding to each other at the positive AC half cycle.

In this illustrated embodiment, the current sampling resistor R3 is shared by the first and the second current sampling units 110, 120. The current sampling resistor R3 is connected to the control unit 40 when the second circuit for sampling current is applied in the system of Embodiments 1-4. In other alternative embodiments, the first current sampling unit 110 and the second current sampling unit do not share a current sampling resistor, and each employs an independent current sampling resistor.

Figure 7A:
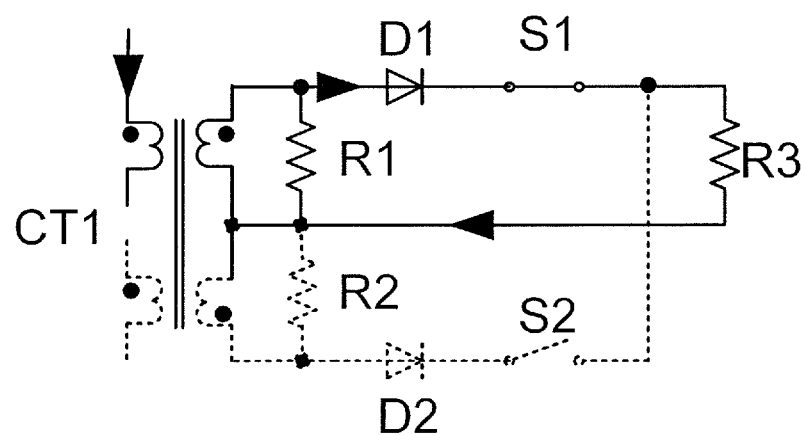
FIG. 7a is a schematic diagram illustrating a forward current of the second circuit for sampling current when sampling according to some embodiments of the present disclosure.
Figure 7B:
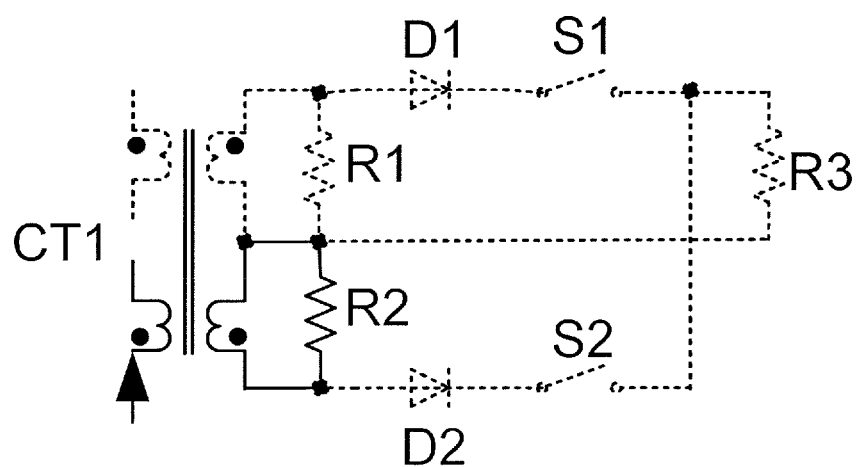
FIG. 7b is a schematic diagram illustrating a reset state of the second circuit for sampling current according to some embodiments of the present disclosure.
Figure 7C:
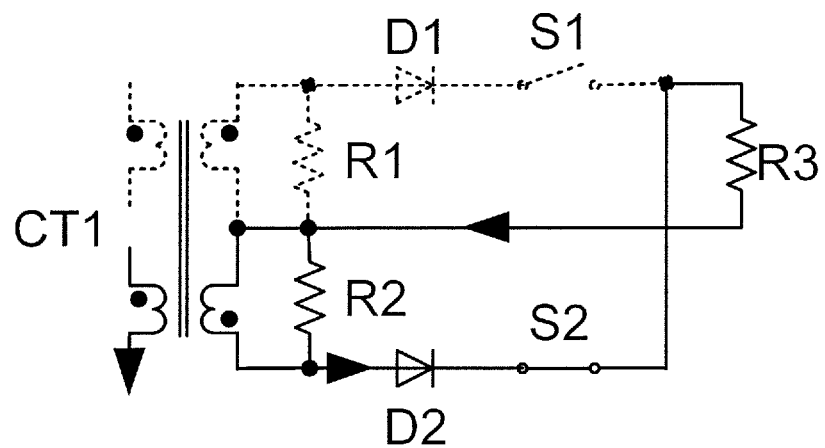
FIG. 7c is another schematic diagram illustrating a forward current of the second circuit for sampling current when sampling according to some embodiments of the present disclosure.
Figure 7D:
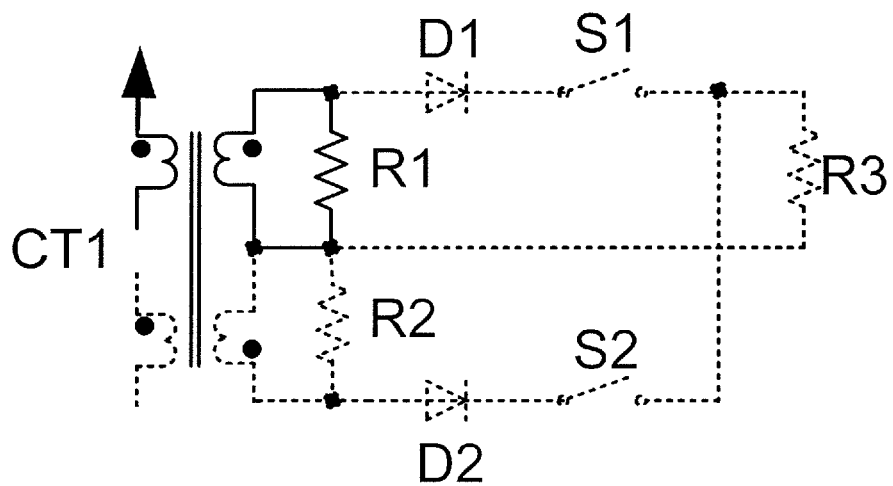
FIG. 7d is another schematic diagram illustrating a reset state of the second circuit for sampling current according to some embodiments of the present disclosure.

FIG. 7a and FIG. 7b shows the working state of the second circuit during the negative AC half cycle. FIG. 7a shows a working state of the second circuit for sampling current. When forward current flows through the first primary winding of the current transformer CT1 and the first sampling switch S1 is turned on at the negative AC half cycle, the forward current also flows through the first secondary winding of the current transformer CT1. As a result, the first secondary winding of the current transformer CT1, the first diode D1, the first sampling switch S1, and the current sampling resistor R3 form an energy storage loop to sample the forward current signal, as shown in the solid line of FIG. 7a. As shown in FIG. 7b, when the first sampling switch S1 is turned off, the second secondary winding of the current transformer CT1 and the second reset resistor R2 form a reset loop, as shown in the solid line of FIG. 7b. FIG. 7c and FIG. 7d shows the working state of the second circuit during the positive AC half cycle. As shown in FIG. 7c, when forward current flows through the second primary winding of the current transformer CT1 and the second sampling switch S2 is turned on at the positive AC half cycle, the forward current also flows through the second secondary winding of the current transformer CT1. As a result, the second secondary winding of the current transformer CT1, the second diode D2, the second sampling switch S2, and the current sampling resistor R3 form an energy storage loop to sample the forward current signal, as shown in the solid line of FIG. 7c. As shown in FIG. 7d, when the second sampling switch S2 is turned off, the first secondary winding of the current transformer CT1 and the first reset resistor R1 form a reset loop, as shown in the solid line of FIG. 7d.

As shown in FIG. 8, the third current sampling unit 310 is achieved by applying the third circuit for sampling current. The third circuit for sampling current includes: a third current transformer CT3, a third reset resistor R4, a diode D3, and a current sampling resistor R5. The third reset resistor R4 and the secondary winding of the third current transformer CT3 are connected in parallel. The diode D3 and the current sampling resistor R5 are connected in series between two ends of the third reset resistor R4. The anode of the diode D3 is connected to one end of the third reset resistor R4. The primary winding of the third current transformer CT3 and the load unit 30 are connected in series between the first parallel connection point 1 and the second parallel connection point 2 and the third reset resistor R4 is connected to the control unit 40 when the third current sampling unit 30 is applied to the system of Embodiments 1-4.

As shown in FIG. 8a, when the signal from the output end of the third current transformer CT3 enters the anode of the diode D3, the current flows through the current sampling resistor R5. As shown in FIG. 8b, when the signal from the output end of the third current transformer CT3 enters the cathode of the diode D3, no current flows through the current sampling resistor R5.

In this illustrated embodiments, the reset resistors R1 and R2 can each be replaced by a voltage-regulator tube (not limited to the tube).

In this illustrated embodiments, the first switch S1 and the second switch S2 are each (not limited to) a metal-oxide-semiconductor field effect transistor (MOSFET) or a bipolar junction transistor (BJT) or the like.

Finally it shall be noted that, the above embodiments are only used to describe but not to limit the technical solutions of the present disclosure; and within the concept of the present disclosure, technical features of the above embodiments or different embodiments may also be combined with each other, the steps may be implemented in an arbitrary order, and many other variations in different aspects of the present disclosure described above are possible although, for purpose of simplicity, they are not provided in the details. Although the present disclosure has been detailed with reference to the above embodiments, those of ordinary skill in the art shall appreciate that modifications can still be made to the technical solutions disclosed in the above embodiments or equivalent substations may be made to some of the technical features, and the corresponding technical solutions will not depart from the scope of the present disclosure due to such modifications or substations.

What is claimed is:

1. A system for sampling current, comprising a Totem-Pole bridgeless circuit which comprises a first bridge arm unit, a second bridge arm unit, and a load unit that are connected in parallel between a first parallel connection point and a second parallel connection point; the first bridge arm unit comprising a first switch tube and a second switch tube which are connected in series in a same direction; the second bridge arm unit comprising a first diode and a second diode which are connected in series in a same direction; the load unit comprising a capacitor and a load resistor which are connected in parallel; a power supply and an inductor connected in series between a first connection point of the first and second switch tubes and a second connection point of the first and second diodes, wherein the system further comprises:

a first current sampling unit, the first current sampling unit and the first switch tube connected in series between the first parallel connection point and the first connection point, and the first current sampling unit configured to sample a current or an induced current flowing through the first switch tube when the first switch tube is turned on at a negative AC half cycle of a power supply input voltage; or the first current sampling unit and the first diode connected in series between the first parallel connection point and the second connection point, and the first current sampling unit configured to sample a current or an induced current flowing through the first diode when the first switch tube is turned on at the negative AC half cycle;

a second current sampling unit, the second current sampling unit and the second switch tube connected in series between the second parallel connection point and the first connection point, and the second current sampling unit configured to sample a current or an induced current flowing through the second switch tube when the second switch tube is turned on at a positive AC half cycle of a power supply input voltage; or the second current sampling unit and the second diode connected in series between the second parallel connection point and the second connection point, and the second current sampling unit configured to sample a current or an induced current flowing through the second diode when the second switch tube is turned on at the positive AC half cycle;

a third current sampling unit, the third current sampling unit and the load unit first connected in series between the first parallel connection point and the second parallel connection point, and the third current sampling unit configured to sample a current flowing through the load unit; and a control unit, connected to the first, second, and third current sampling units, the first switch tube, and the second switch tube, and the control unit configured to control the turn-on or turn-off of the first switch tube and the second switch tube according to current signals sampled by the first, second, and third current sampling units;

wherein the first current sampling unit and the second current sampling unit each comprise: a reset resistor, a diode, and a sampling switch;

the first current sampling unit and the second current sampling unit shares a common current transformer and a common current sampling resistor;

the current transformer comprises a first primary winding, a first secondary winding, a second primary winding, and a second secondary winding;

in the first current sampling unit, the reset resistor and two ends of the first secondary winding are connected in parallel; the sampling switch, the diode, and the current sampling resistor are connected in series, and then are connected to two ends of the reset resistor in parallel;

in the second current sampling unit, the reset resistor and two ends of the second secondary winding are connected in parallel; the sampling switch, the diode, and the current sampling resistor are connected in series, and then are connected to two ends of the reset resistor in parallel;

the first primary winding of the first current sampling unit and the first switch tube are connected in series between the first parallel connection point and the first connection point, or the first primary winding of the first current sampling unit and the first diode are connected in series between the first parallel connection point and the second connection point;

the second primary winding of the second current sampling unit and the second switch tube are connected in series between the second parallel connection point and the first connection point, or the second primary winding of the second current sampling unit and the second diode are connected in series between the second parallel connection point and the second connection point;

the current sampling resistor is connected to the control unit, and the first current sampling unit or the second current sampling unit is configured to sample a flowing current when the sampling switch of the first current sampling unit or the second current sampling unit is turned on;

wherein in the first current sampling unit: a cathode of the diode connected to the sampling switch, and an anode of the diode connected to one end of the first secondary winding and one end of the reset resistor; and wherein in the second current sampling unit: a cathode of the diode connected to the sampling switch, and an anode of the diode connected to one end of the second secondary winding and one end of the reset resistor.

2. The system according to claim 1, wherein switching sequences of the sampling switch of the first current sampling unit and the first switch tube are the same as each other or corresponding to each other; and switching sequences of the sampling switch of the second current sampling unit and the second switch tube are the same as each other or corresponding to each other.

3. The system according to claim 1, wherein the first and second sampling switch tubes are each a metal-oxide-semiconductor field effect transistor or a bipolar junction transistor.

4. The system according to claim 1, wherein the first current sampling unit and the first switch tube are connected in series between the first parallel connection point and the first connection point, and the second current sampling unit and the second switch tube are connected in series between the second parallel connection point and the first connection point.

5. The system according to claim 1, wherein the first current sampling unit and the first switch tube are connected in series between the first parallel connection point and the first connection point, and the second current sampling unit and the second diode are connected in series between the second parallel connection point and the second connection point.

6. The system according to claim 1, wherein the first current sampling unit and the first diode are connected in series between the first parallel connection point and the second connection point, and the second current sampling unit and the second switch tube are connected in series between the second parallel connection point and the first connection point.

7. The system according to claim 1, wherein the first current sampling unit and the first diode are connected in series between the first parallel connection point and the second connection point, and the second current sampling unit and the second diode are connected in series between the second parallel connection point and the second connection point.

8. The system according to claim 1, wherein the third current sampling unit comprises a current transformer, a reset resistor, a diode, and a current sampling resistor; the current transformer comprises a primary winding and a second winding; the reset resistor and the secondary winding are connected in parallel, the diode and the current sampling resistor are connected in series between two ends of the reset resistor; an anode of the diode is connected to one end of the reset resistor and a cathode of the diode is connected to the current sampling resistor; the primary winding and the load unit are connected in series between the first parallel connection point and the second parallel connection point; the current sampling resistor is connected to the control unit.

* * * * *